United States Patent
Lai et al.

(10) Patent No.: US 7,978,110 B2
(45) Date of Patent: Jul. 12, 2011

(54) DIGITAL-TO-ANALOG CONVERTER

(75) Inventors: Yu-Jen Lai, Taichung (TW); Mei-Chen Chuang, Hsin-Chu (TW); Wen-Shen Chou, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/708,417

(22) Filed: Feb. 18, 2010

(65) Prior Publication Data
US 2010/0283642 A1 Nov. 11, 2010

Related U.S. Application Data

(60) Provisional application No. 61/177,151, filed on May 11, 2009.

(51) Int. Cl.
*H03M 1/66* (2006.01)
(52) U.S. Cl. .......................... 341/145; 341/120; 341/144
(58) Field of Classification Search .................. 341/120, 341/144–145
See application file for complete search history.

(56) References Cited

U.S. PATENT DOCUMENTS

| | | | |
|---|---|---|---|
| 5,446,455 A | 8/1995 | Brooks | |
| 5,517,191 A | 5/1996 | Wynne | |
| 5,640,381 A | 6/1997 | Call et al. | |
| 5,646,619 A | 7/1997 | Daubert et al. | |
| 5,666,118 A | 9/1997 | Gersbach | |
| 5,703,586 A | 12/1997 | Tucholski | |
| 5,760,726 A | 6/1998 | Koifman et al. | |
| 5,870,044 A | 2/1999 | Dell'ova et al. | |
| 5,955,980 A | 9/1999 | Hanna | |
| 6,130,632 A | 10/2000 | Opris | |
| 6,489,905 B1 | 12/2002 | Lee et al. | |
| 6,501,402 B2 | 12/2002 | Boxho | |
| 6,583,744 B2 * | 6/2003 | Bright | 341/145 |
| 6,664,909 B1 | 12/2003 | Hyde et al. | |
| 6,703,956 B1 * | 3/2004 | Mueller et al. | 341/145 |
| 6,897,794 B2 | 5/2005 | Kuyel et al. | |
| 6,927,719 B1 | 8/2005 | Siniscalchi | |
| 7,002,496 B2 | 2/2006 | Kuyel | |
| 7,026,967 B2 | 4/2006 | Eloranta | |
| 7,068,201 B1 | 6/2006 | Chou | |
| 7,076,384 B1 | 7/2006 | Radulov et al. | |
| 7,312,740 B2 * | 12/2007 | Chou | 341/145 |
| 7,369,076 B1 | 5/2008 | Chung et al. | |
| 2009/0278723 A1 | 11/2009 | Chuang et al. | |

OTHER PUBLICATIONS

Groeneveld, D., et al., "A Self-Calibration Technique for Monolithic High-Resolution D/A Converters", IEEE International Solid-State Circuits Conference, Dec. 1989, pp. 1517-1522, 36th ISSCC Digest of Technical Papers, New York, NY, United States.

(Continued)

*Primary Examiner* — Khai M Nguyen
(74) *Attorney, Agent, or Firm* — Slater & Matsil, L.L.P.

(57) ABSTRACT

A system for converting a digital signal to an analog signal is provided. The present invention provides a digital-to-analog converter (DAC) that can convert a large bit value digital signal to a corresponding analog signal. The digital-to-analog converter includes a bias regeneration circuit, and three sub-DACs. The bias regeneration circuit provides biasing to the three sub-DACs allowing the DAC to be implemented with smaller circuit area. In addition, the three sub-DACs may be digitally calibrated during the conversion process to increase the linearity of the DAC.

20 Claims, 5 Drawing Sheets

OTHER PUBLICATIONS

Bastos, J., et al., "A 12-Bit Intrinsic Accuracy High-Speed CMOS DAC", IEEE Journal of Solid-State Circuits, Dec. 1998, pp. 1959-1969, vol. 33, No. 12.

Bugeja, A., et al., "A Self-Trimming 14-b 100-MS/s CMOS DAC", IEEE Journal of Solid-State Circuits, Dec. 2000, pp. 1841-1852, vol. 35, No. 12.

Cong, Y., et al., "A 1.5-V 14-Bit 100-MS/s Self-Calibrated DAC", IEEE Journal of Solid-State Circuits, Dec. 2003, pp. 2051-2060, vol. 38, No. 12.

Chen, H., et al., "A 14-b 150 MS/s CMOS DAC with Digital Background Calibration", Symposium on VLSI Circuits Digest of Technical Papers, 2006, pp. 51-52, Honolulu, HI, United States.

Clara, M., et al., "A 1.5V 200MS/s 13b 25mW DAC with Randomized Nested Background Calibration in 0.13μm CMOS", IEEE International Solid-State Circuits Conference, Feb. 2007, pp. 250-600, ISSCC Digest of Technical Papers, San Francisco, CA, United States.

Chen, T., et al., "A 14-bit 200-MHz Current-Steering DAC With Switching-Sequence Post-Adjustment Calibration", IEEE Journal of Solid-State Circuits, Nov. 2007, pp. 2386-2394, vol. 42, No. 11.

* cited by examiner

DIGITAL-TO-ANALOG CONVERTER

This application claims the benefit of U.S. Provisional Application Ser. No. 61/177,151, filed on May 11, 2009, entitled Digital-to-Analog Converter, which application is hereby incorporated herein by reference.

TECHNICAL FIELD

The present invention relates generally to a system and method for improving digital-to-analog conversion and, more particularly, to a system and method for improving the linearity of a digital-to-analog converter while reducing the circuit area necessary for implementation.

BACKGROUND

A digital-to-analog converter (DAC) is a device or circuit element that converts digital codes into a continuous range of analog signal levels, i.e., the device constructs an analog signal from a digital signal. Resolution, sampling rate, speed, and linearity determine the quality of performance of a DAC. Higher resolution and greater linearity with increasing speed are preferred.

One type of DAC is a binary-weighted DAC that converts a digital signal to an analog signal by weighting a voltage or a current according to each bit in the digital signal or digital code. The weighted voltage or current assigned to each bit in the digital signal or digital code are then summed together to create an analog signal. Another type of DAC is a thermometer-coded DAC design that converts the incoming binary digital signals to thermometer-coded signals that have one bit for each possible value of the incoming digital signal. The number of asserted bits in the thermometer code is proportional to the value of the incoming digital signal. When a bit is asserted, a corresponding element generates an output analog signal.

Many modern DACs are hybrid DACs that reduce die area by splitting the digital signal into portions that are then converted by sub-DACs of varying types, such as the binary and thermometer-coded DACs described above. Unfortunately, these modern conversion methods require large circuit area to implement the conversion process. For example, a modern 12-bit current steering hybrid DAC will require the use of 4096 CMOS devices to implement the digital-to-analog conversion process. Similarly, a modern 14-bit current steering hybrid DAC will require approximately 16000 CMOS devices to implement the digital-to-analog conversion process.

It is also necessary to calibrate modern DACs to decrease linearity errors caused by the fabrication process used to create the DAC. One prior art method to calibrate a DAC utilizes a higher resolution analog to digital converter (ADC) to perform the calibration during the conversion process. The increased complexity necessary to implement this calibration process can ultimately amplify linearity errors and increase the total die area needed to perform the digital-to-analog conversion. Another prior art method uses a floating gate calibration method to calibrate the DAC. However, the effects of channel charge injection and leakage current require the recharging and recalibration of the DAC, slowing the DAC down. Ultimately, including calibration processes further increase the DAC demand for circuit area.

Due to the requirements of even greater circuit area to perform a calibrated conversion process, some DACs perform the digital-to-analog conversion process without calibrating the current or voltage values within the DAC. Failure to calibrate increases linearity errors and limits the resolution of a DAC. Thus, calibration of the DAC, regardless of type, is necessary to reduce processing variations and component value mismatching and, consequently, linearity errors. Therefore, there is a need for a system and method of calibrating a DAC while also reducing the circuit area necessary to implement the digital-to-analog conversion process.

SUMMARY OF THE INVENTION

These and other problems are generally solved or circumvented, and technical advantages are generally achieved, by illustrative embodiments of the present invention which provide a digital-to-analog converter.

In accordance with an embodiment of the present invention, a digital-to-analog converter is provided. The digital-to-analog converter (DAC) comprises a plurality of sub-DACs configured to receive portions of a digital signal and to convert the received portions of the digital signal to a corresponding analog signal. The DAC also comprises a bias regeneration circuit configured to bias one or more of the plurality of sub-DACs, and the one or more of the plurality of sub-DACs having one or more digital calibration elements for calibrating the portions of the digital signal.

In accordance with another embodiment of the present invention, a 12-bit digital-to-analog converter is provided. The 12-bit digital-to-analog converter (DAC) comprises a 12-bit digital signal line divided into portions such that a 3-bit least significant bits portion is directed to a first sub-DAC, a 3-bit most least significant bits portion is directed to a second sub-DAC, and a 6-bit most significant bits portion is directed to a third sub-DAC. The 12-bit DAC includes a bias regeneration circuit configured to bias the first sub-DAC, and the second sub-DAC and the third sub-DAC configured to receive a bias signal. The 12-bit DAC also includes digital calibration elements coupled to the first, second, and third sub-DACs such that the digital signal portions may be calibrated before the conversion process.

In accordance with yet another embodiment of the present invention, a 14-bit digital-to-analog converter is provided. The 14-bit digital-to-analog converter (DAC) comprises a 14-bit digital signal line divided into portions such that a 4-bit least significant bits portion is directed to a first sub-DAC, a 6-bit most least significant bits portion is directed to a second sub-DAC, and a 4-bit most significant bits portion is directed to a third sub-DAC. The 14-bit DAC also includes a bias regeneration circuit configured to bias the first sub-DAC, and the second sub-DAC and the third sub-DAC configured to receive a bias signal. The 14-bit DAC also includes digital calibration elements coupled to the first, second, and third sub-DACs such that the digital signal portions may be calibrated before the conversion process.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
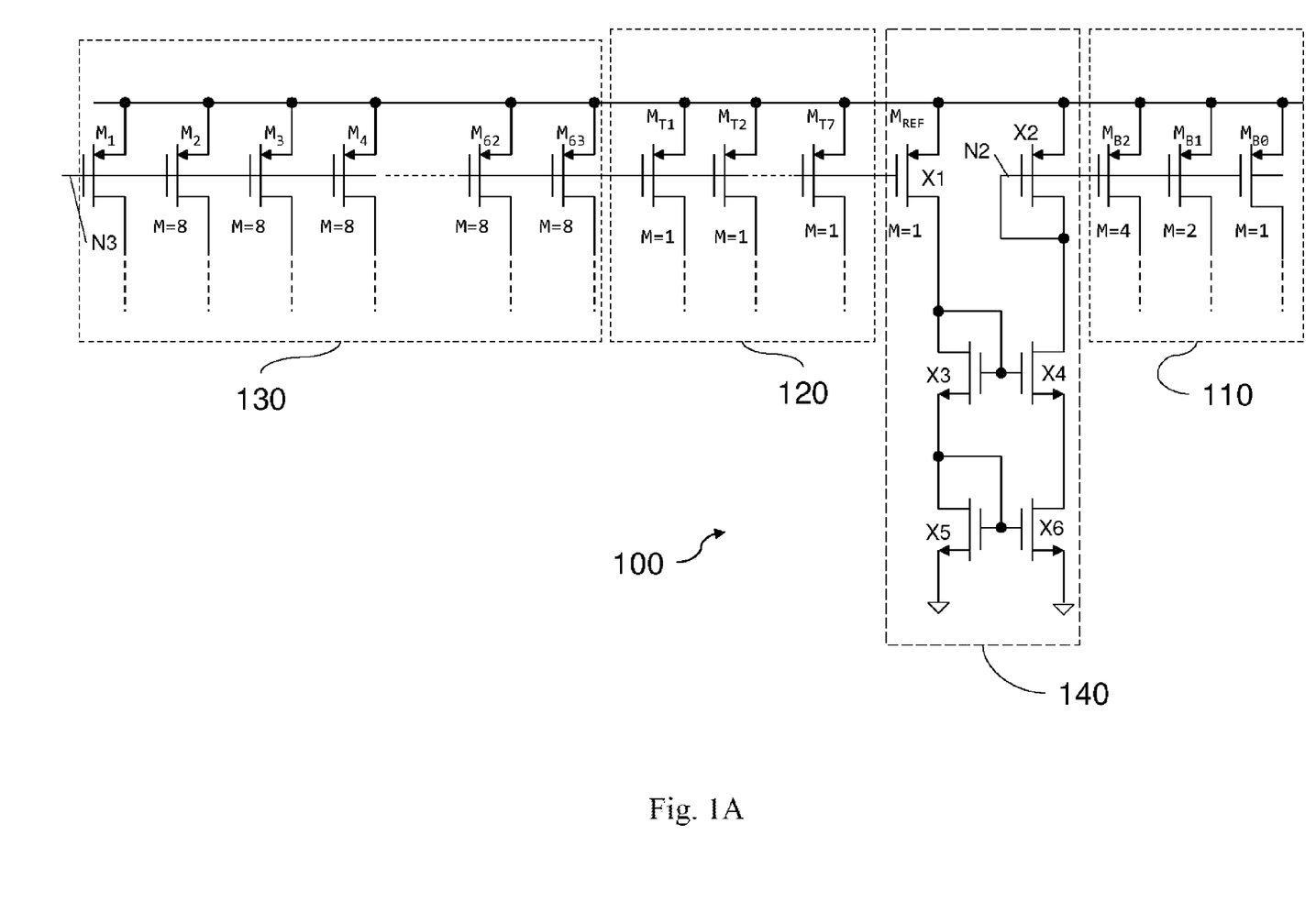
FIG. 1A is a schematic representation of a portion of a 12-bit digital-to-analog converter in accordance with an embodiment of the present invention.

With reference now to FIG. 1A, there is shown is a schematic diagram of a current source section of a hybrid 12-bit digital-to-analog converter (DAC) 100 according to an embodiment of the present invention. The 12-bit DAC 100 of FIG. 1A comprises three sub-DACs, a 3-bit least least significant bit (LLSB) binary weighted DAC 110, a 3-bit most least significant bit (MLSB) thermometer-coded DAC 120, and a 6-bit most significant bit (MSB) thermometer-coded DAC 130. The 12-bit DAC 100 also comprises a bias regeneration circuit 140. In the illustrated embodiment, the MLSB DAC 120 is subject to digital calibration as described below with respect to FIG. 1B.

In the illustrative embodiment, a 12-bit signal is communicatively coupled to the 12-bit DAC 100 such that the three least significant bits (1-3) are communicatively coupled to the LLSB DAC 110. Similarly, the next three bits (4-6) are communicatively coupled to the MLSB DAC 120, and the six most significant bits (7-12) are communicatively coupled to the MSB DAC 130. In addition, the LLSB DAC 110 is configured to be biased by the bias regeneration circuit 140.

In the exemplary 12-bit DAC 100, each sub-DAC is comprised of current source elements which are used to perform the conversion from a digital signal to an analog signal. PMOS transistors are used to implement the current source elements of each sub-DAC. In the illustrative operative embodiment, the bias regeneration circuit 140 is employed to bias the LLSB DAC 110, the MLSB DAC 120, and the MSB DAC 130.

As illustrated in FIG. 1A, the binary weighted LLSB DAC 110 comprises three PMOS transistors $M_{B0}$, $M_{B1}$, and $M_{B2}$. Each transistor has a plurality of legs/fingers which limit the size of the conduction current produced by the transistor. Where the PMOS transistor $M_{B0}$ for the LLSB DAC 110 has one finger, i.e., M=1, the PMOS transistors $M_{B1}$, and $M_{B2}$ for the upper bits will have 2, and 4 fingers, respectively. The number of fingers is represented by the M number. The larger the number of fingers of the transistor, the larger the conduction current. Thereby, the PMOS transistor $M_{B1}$ is twice as large in size and conduction current as the PMOS transistor $M_{B0}$. In this way, the PMOS transistor $M_{B1}$ provides twice as much current to the output analog signal when the digital bit to which it corresponds is asserted. In the illustrated embodiment the LLSB DAC 110 current source elements are implemented with seven CMOS devices. The bias regeneration circuit 140 biases the gate voltages of the PMOS transistors of the LLSB DAC 110. Biasing the gate voltages allows the conduction current in each current source element to be scaled, thus allowing other fingers of the LLSB DAC 110 current source elements to be used to generate the analog equivalent of the least significant bits of a digital signal.

In most modern DACs, transistor sizes are scaled for each current source element so that each individual bit of the digital signal has a weighted analog current. As the digital signal bit size increases, larger transistors are necessary for the more significant bits. In the illustrated embodiment, the conduction current for each current source element of the MLSB DAC 120, and the MSB DAC 130 is the same, but the fingers are scaled to provide a designed scale current, as each current source element is biased by the same node and has an identical transistor size.

The bias regeneration circuit 140 allows the nodes N2 and N3 to be biased at different voltages, consequently the conduction current of each sub-DAC may be scaled and implemented with smaller transistors. PMOS transistors $M_{B0}$, $M_{B1}$, and $M_{B2}$ of the LLSB DAC 110 are biased by a node N2, and PMOS transistors $M_{T1}$ thru $M_{T7}$ of the MLSB DAC 120, and $M_1$ thru $M_{63}$ of the MSB DAC 130 are biased by a node N3. The bias regeneration circuit 140 comprises a pair of PMOS transistors X1 and X2, and NMOS transistors X3, X4, X5 and X6. The bias regeneration circuit 140 is connected to the node N3 such that the node N3 biases X1, and the node N2 biases the LLSB 110. The node N2 is connected to a gate of the PMOS transistor X2. The node N3 is connected to a gate of the PMOS transistor X1. When transistor sizes of X1, X3 and X5 equal the transistor sizes of X2, X4 and X5, respectively, a conduction current flowing through the PMOS transistor X1 equals the conduction current flowing through the PMOS transistor X2. In this case, the voltage at N2 becomes the same as the voltage at N3. Through adjusting the ratio of the transistor sizes between the transistor group comprised of X1, X3, X5, and the transistor group comprised of X2, X4 and X6, a desired voltage ratio between the voltages at N2 and N3 can be achieved. In this manner, the LLSB sub-DAC 110 of the 12-bit DAC 100 of FIG. 1A may be biased by an appropriate voltage, allowing the node N2 and the node N3 to be different. The difference between the nodes N2, and N3, respectively, removes the requirement that the MLSB sub-DAC 120, and the MSB sub-DAC 130 be scales of the devices in the LLSB sub-DAC 110. A person of ordinary skill in the art will understand that other means may be used to control the voltage ratio between the voltages at N2 and N3, and that those mechanisms are contemplated by the present invention.

In the LLSB DAC 110, the MLSB DAC 120, and the MSB DAC 130, the bias regeneration circuit 140 changes the bias condition of the least significant bit in each DAC segment, respectively, creating a DAC architecture utilizing a total of 518 devices as compared to the 4096 used by prior art DAC implementations, cutting the area to about ⅛th the original size.

Figure 1B:
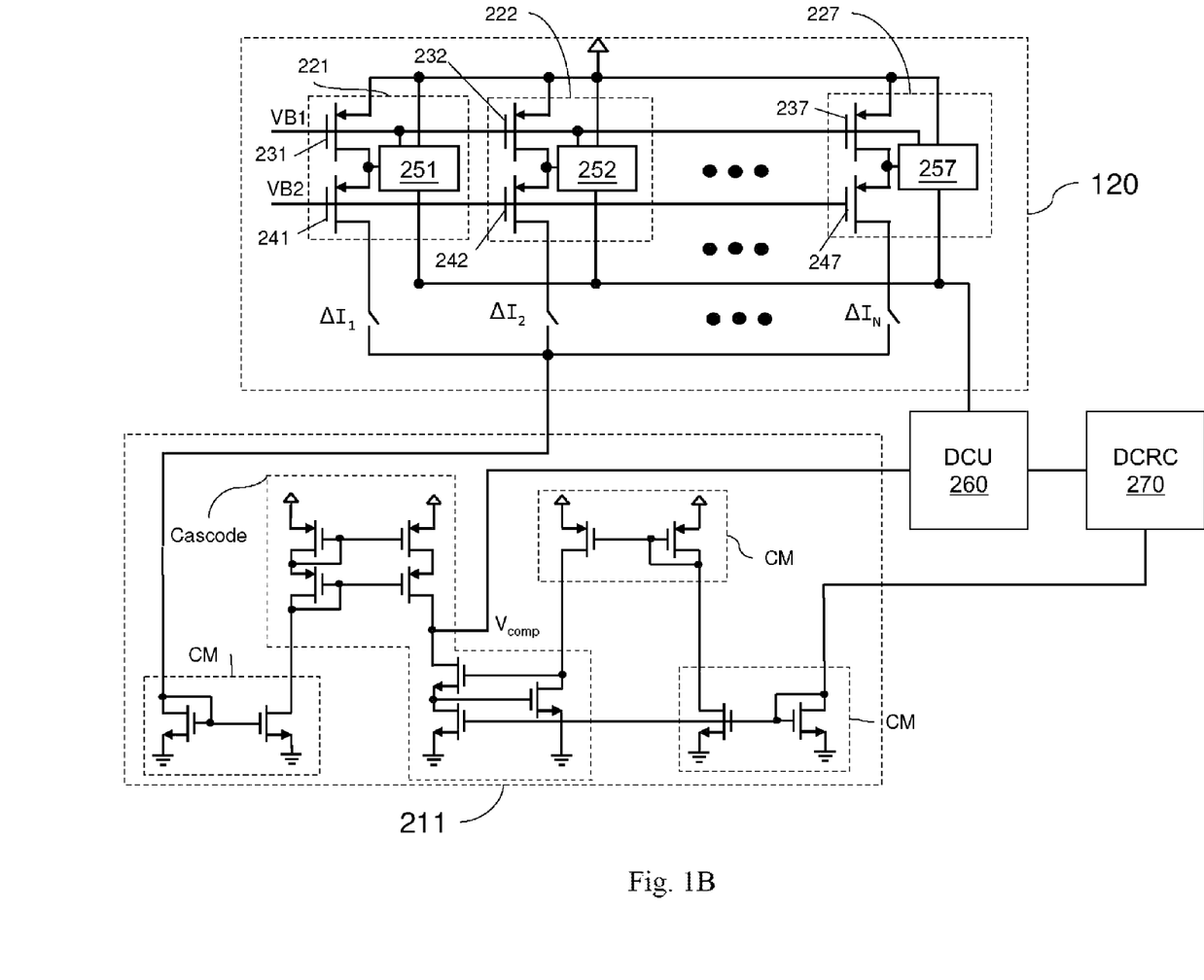
FIG. 1B is a schematic representation of a portion of the 12-bit digital-to-analog converter of FIG. 1A.

With reference now to FIG. 1B, there is shown a portion of the MLSB DAC 120 of the 12 bit DAC 100 of FIG. 1A. In the illustrated embodiment, current source elements 221 through 227 are shown, and each current source element comprises a first transistor, a second transistor, and a digital calibration circuit (DCC). For example, the first MLSB current source element 221 comprises a first transistor 231, a second transistor 241, and a DCC 251. MLSB current source elements 222 through 227 comprise a similar arrangement as shown in FIG. 1B. VB1 is the biasing voltage produced by a bias circuit (not shown). A person of ordinary skill in the art will understand that a designer may select various biasing circuits to adjust the performance of the DAC 100 of FIG. 1A to meet the needs of a particular situation. VB1 biases each current source element of the MLSB segment of the DAC and, consequently, controls the current of each current source element. VB2 is a second biasing voltage used to increase the upper impedance of each current source element, the upper limit of which is determined by VB1.

The digital calibration circuits 251 thru 257, respectively, act as fine-tuning or trimming CMOS devices. In the illustrated embodiment, the first transistor 221 and the DCC 251 are biased with VB1, in this manner digital control is added to the device by each calibration circuit. Also shown in FIG. 1B is a current comparison circuit 211, a digital control unit (DCU) 260, and a digital calibration reference current source (DCRC) 270. In the thermometer-coded MLSB DAC 120 of FIG. 1A each MLSB current source element has the same output current height, digital calibration is used in order to ensure that the output current of each MLSB current source element is the same.

In an illustrative operative embodiment of digital calibration of the first MLSB current source element 221, the current from the first MLSB current source element 221 is switched to the current comparison circuit 211 by the DCU 260. The current comparison circuit 211 compares the current from the first MLSB current source element 221 to the reference current produced by the DCRC 270. Where the current from the first MLSB current source element 221 is smaller than the reference current from the DCRC 270, the DCU 260 enables the DCC 251 to add current to the first MLSB current source element 221 until the current from the first MLSB current source element 221 matches the reference current from the DCRC 270. In the event that the current from the first MLSB current source element 221 matches the current from the DCRC 270, the DCU 260 switches the current to the next MLSB current source element and repeats the process until each MLSB current source element has been calibrated. The DCU 260 controls the process as described with respect to FIG. 2. A person of ordinary skill in the art will understand that the process described above may be applied to other segments of the 12-bit DAC 100 of FIG. 1A, such as the 6-bit MSB DAC 130.

The current comparison circuit 211 uses a cascode architecture and current mirrors to create a high impedance point where the current source element current from the MLSB DAC 120 and the reference current from DCRC 270 are compared. In an illustrative operative embodiment of current comparison of the first MLSB current source element 221, shown in FIG. 1B, the current from the first MLSB current source element 221 is mirrored by the current mirrors (CM) shown as part of the current comparison circuit 211 to $V_{comp}$. Similarly, the reference current from DCRC 270 is mirrored by the current mirrors (CM) shown as part of the current comparison circuit 211 to $V_{comp}$.

$V_{comp}$ is a high impedance point, such that when the current from the first MLSB current source element 221 is different from the reference current from the DCRC 270, the voltage at $V_{comp}$ will change drastically. As illustrated, the reference current from DCRC 270 pulls $V_{comp}$ low, while the current from the first MLSB current source element 221 pulls $V_{comp}$ high. Where the difference between the current from the first MLSB current source element 221 and the reference current from the DCRC 270 is larger, the $V_{comp}$ will be larger, in the illustrated embodiment about 2.5 volts. Where the difference between the current from the first MLSB current source element 221 and the current from the DCRC 270 is smaller, the $V_{comp}$ voltage is smaller, in the illustrated embodiment about 0.5 volts. The varying voltage of the $V_{comp}$ node feeds back to the DCU 260, where in the event that the $V_{comp}$ is above a designated threshold the DCU 260 will enable the DCC 251 to add current to the first MLSB current source element 221. The high impedance technique described herein increases the accuracy of the DAC from microamps to picoamps and improves overall linearity of the DAC.

Figure 1C:
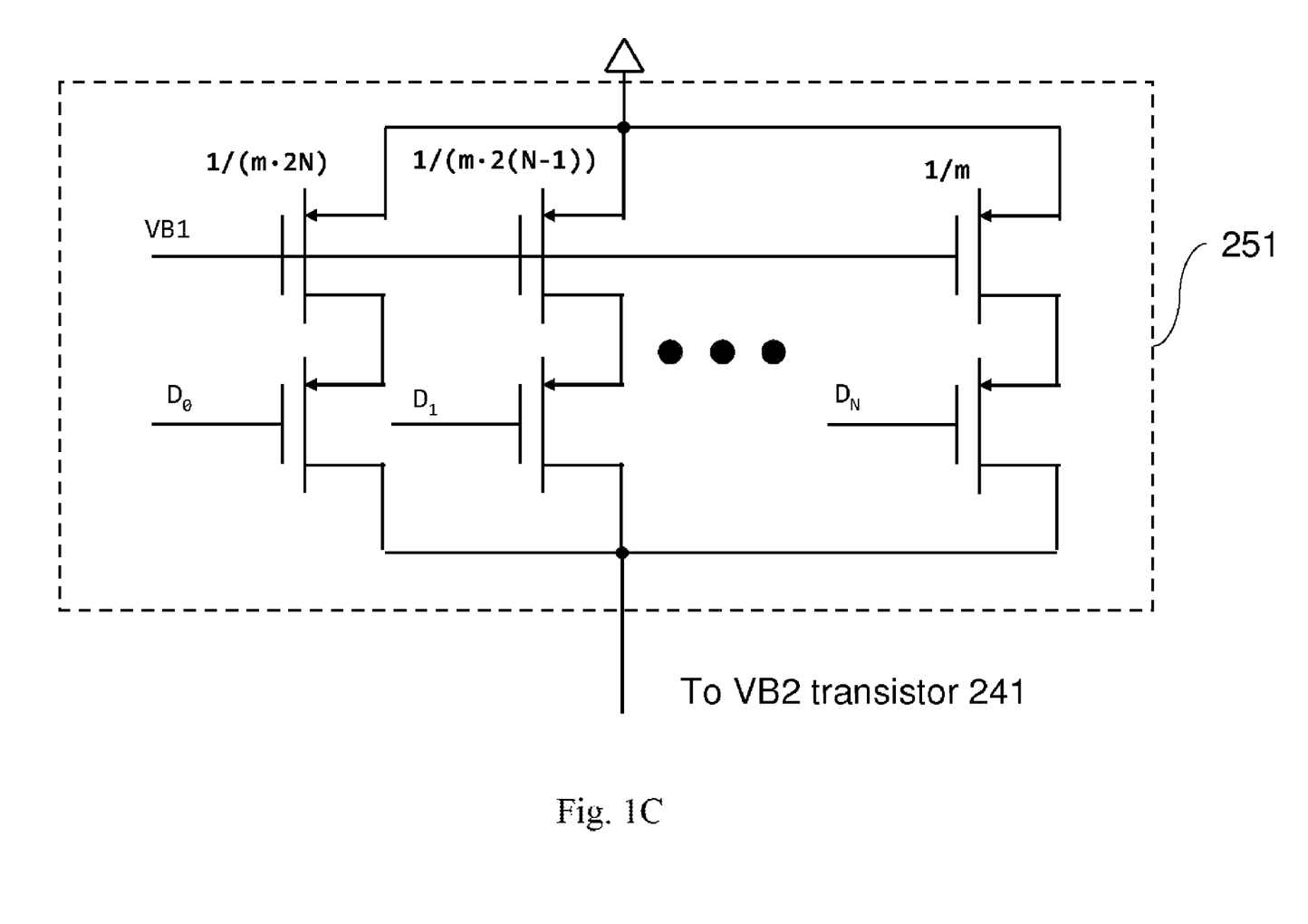
FIG. 1C is a schematic representation of a digital calibration element of FIG. 1B.

Referring now to FIG. 1C, there is shown the first MLSB DCC 251, an exemplary DCC. The first MLSB DCC 251 is implemented with an array of CMOS devices. For the exemplary DCC 251 shown in FIG. 1C, each CMOS device size is smaller than VB1 device size, i.e., they are fractional portions of the current source element that is biased by VB1, represented here by the transistors labeled $$\frac{1}{(m \times 2N)}, \frac{1}{(m \times 2(N-1))}, \cdots \frac{1}{m}.$$

Because the DCC 251 output is also connected to the second transistor biased by the VB2 current source, for each current source when the upper current represented by VB1 is different from a reference current, the DCU 260 of FIG. 1B, selects the fractional device within the DCC 251 to supplement the output current, thus adjusting each digital bit to control the current output, allowing the DCU 260 to fine tune each current source element's current output at the summation of all current source elements in the MLSB DAC by adding additional current to the individual current source elements so that the current source element current matches the reference current. Control of the current of each current source element allows for a substantial increase in linearity ultimately improving the resolution of the DAC.

Figure 2:
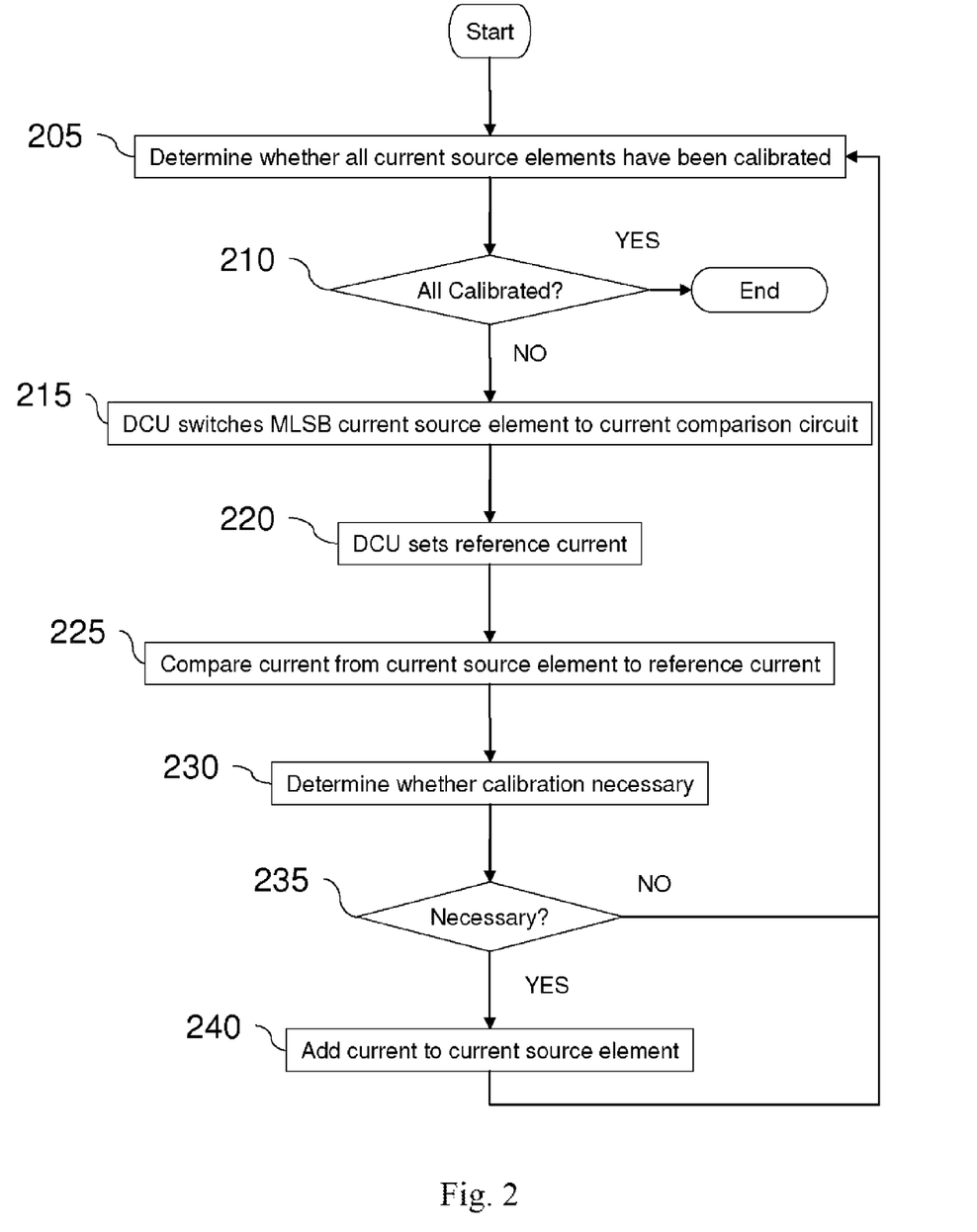
FIG. 2 is a high-level flowchart illustrating operative steps of the process of digital calibration in accordance with an embodiment of the present invention.

Referring now to FIG. 2, there is shown a high-level flowchart illustrating the operational steps performed by the digital control unit 260 of FIG. 1B during calibration of the MLSB DAC 120 of FIG. 1A. As illustrated at block 205, the digital control unit 260 initially determines whether all MLSB current source elements of the MLSB DAC 120 of FIG. 1A have been calibrated. As indicated in decisional block 210, in the event that all MLSB current source elements have been calibrated the process continues on the YES path, where the process ends. In the event that all MLSB current source elements have not been calibrated, the process continues on the NO path to block 215, where the process switches to the next sequential MLSB current source element for calibration. For example, the digital control unit 260 switches the first MLSB current source element 221 of FIG. 1B such that the current from first MLSB current source element 221 flows to the current comparison circuit 211 of FIG. 1B. The digital control unit 260 also instructs the digital control reference current circuit 270 of FIG. 1B to set the reference current for the first MLSB current source element 221, as indicated at block 220.

Next, as indicated at block 225, the digital comparison circuit 210 compares the current from the first MLSB current source element 221 to the reference current from the digital control reference current 270, and the resulting voltage at Vcomp is read by the digital control unit 260. The digital control unit 260 then determines whether the first MLSB current source element 221 needs to be calibrated, as shown at block 230. As indicated at decisional block 235, in the event that the first MLSB current source element 221 needs to be calibrated the system follows the YES path to block 240, where the digital control unit 260 instructs the first MLSB current source element DCC 251 to add current to the first MLSB current source element 221. The DCU 260 then determines whether all MLSB current source elements have been calibrated, as described at block 205. As shown at decisional block 235, in the event that the first MLSB current source element 221 does not need to be calibrated, the system follows the NO path to block 205, where the DCU 260 again determines whether all MLSB current source elements have been calibrated.

Figure 3:
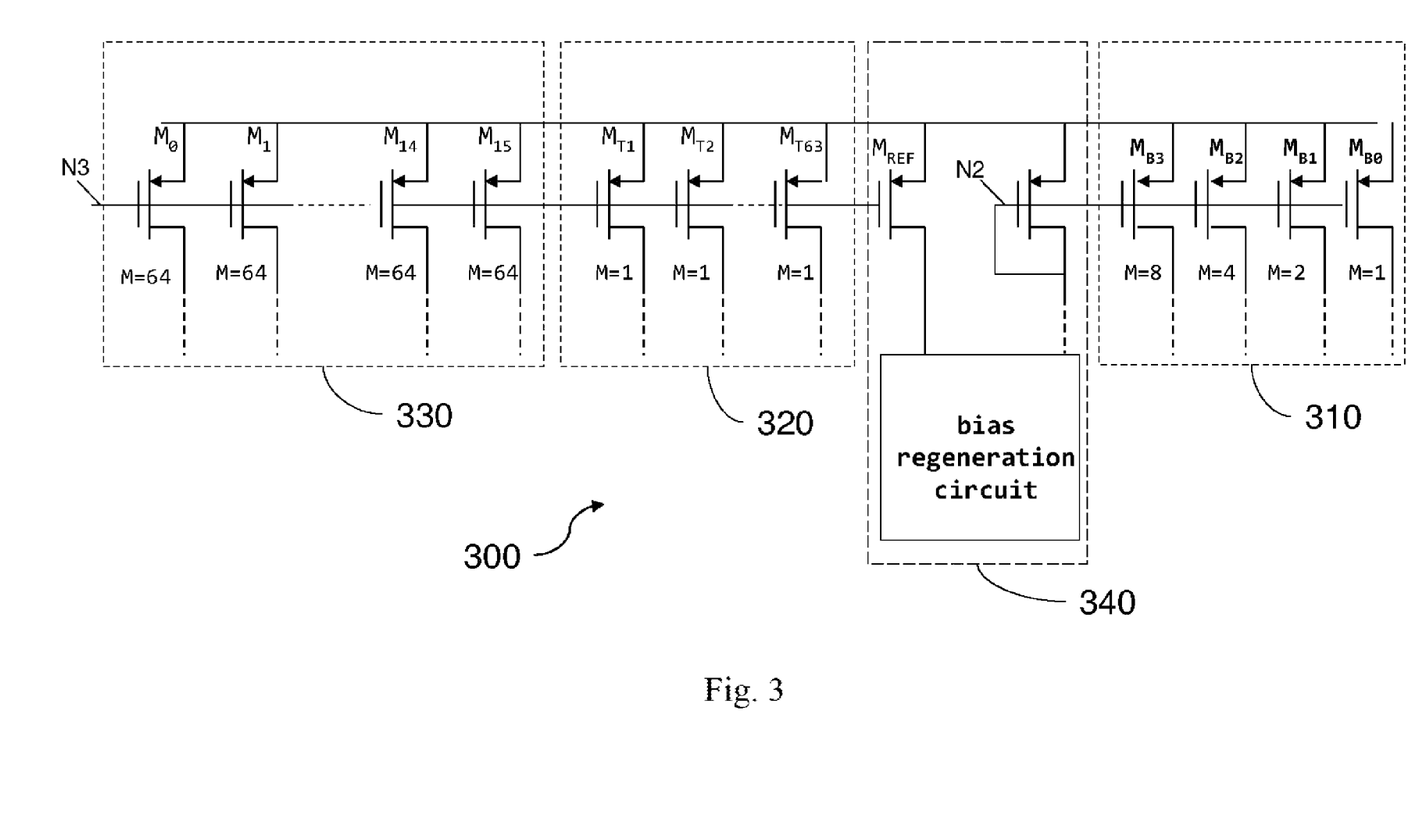
FIG. 3 is a schematic representation of a portion of a 14-bit digital-to-analog converter in accordance with an embodiment of the present invention.

With reference now to FIG. 3, there is shown is a schematic diagram of a current source section of a hybrid 14-bit digital-to-analog converter (DAC) 300 according to one embodiment of the present invention. The 14-bit DAC of FIG. 3 comprises three sub-DACs, a 4-bit least least significant bit (LLSB) binary weighted DAC 310, a 6-bit most least significant bit (MLSB) thermometer-coded DAC 320, and a 4-bit most significant bit (MSB) thermometer-coded DAC 330. The 14-bit DAC 300 also comprises a bias regeneration circuit 340. In the illustrated embodiment, the MLSB DAC 320 is subject to digital calibration as described above with respect to FIG. 1B. Generally, the 14-bit DAC 300 of FIG. 3 is subjected to bias regeneration and digital calibration as described above with respect to the 12-bit DAC 100 of FIG. 1A. The DAC architecture illustrated by the 14-bit DAC 300 utilizes a total of 1039 devices as compared to the approximately 16000 used by prior art 14-bit DACs, again cutting the area to about 1/16th the original size.

Although the present invention and its advantages have been described in detail, it should be understood that various changes, substitutions and alterations can be made herein without departing from the spirit and scope of the invention as defined by the appended claims. For example, [many of the features and functions discussed above can be implemented in software, hardware, or firmware, or a combination thereof. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A digital-to-analog converter (DAC) comprising:
    a plurality of sub-DACs configured to receive portions of a digital signal and to convert the received portions of the digital signal to a corresponding analog signal;
    a bias regeneration circuit configured to bias one or more of the plurality of sub-DACs; and
    one or more digital calibration elements coupled to the one or more of the plurality of sub-DACs, the one or more digital calibration elements calibrating the portions of the digital signal.

2. The DAC of claim 1, wherein the plurality of sub-DACs comprise:
    a binary weighted first DAC segment having a first plurality of current source elements capable of producing a first plurality of conduction currents corresponding to the portion of the digital signal received;
    a thermometer-coded second DAC segment having a second plurality of current source elements capable of producing a second plurality of conduction currents corresponding to the portion of the digital signal received; and
    a thermometer-coded third DAC segment having a third plurality of current source elements capable of producing a third plurality of conduction currents corresponding to the portion of the digital signal received.

3. The DAC of claim 2, wherein:
    the digital signal comprises a 12-bit digital signal;
    the first DAC segment is coupled to receive a 3-bit least significant bits portion of the 12-bit digital signal;
    the second DAC segment is coupled to receive a 3-bit most least significant bits portion of the 12-bit digital signal; and
    the third DAC segment is coupled to receive a 6-bit most significant bits portion of the 12-bit digital signal.

4. The DAC of claim 2, wherein:
    the digital signal comprises a 14-bit digital signal;
    the first DAC segment is coupled to receive a 4-bit least significant bits portion of the 14-bit digital signal;
    the second DAC segment is coupled to receive a 6-bit most least significant bits portion of the 14-bit digital signal; and
    the third DAC segment is coupled to receive a 4-bit most significant bits portion of the 14-bit digital signal.

5. The DAC of claim 2, wherein the bias regeneration circuit comprises a current mirror capable of achieving a desired voltage ratio, the bias regeneration circuit being coupled adjacent to the first DAC and the second DAC, the second DAC coupled adjacent to the third DAC, the desired voltage ratio biasing the first, second, and third DACs at different voltages.

6. The DAC of claim 5, wherein the current mirror comprises a first PMOS transistor having a gate connected to a first control signal and a second PMOS transistor having a gate connected to a second control signal.

7. The DAC of claim 1, wherein the one or more digital calibration elements comprise:
    one or more digital calibration circuits coupled to one or more current source elements of the plurality of sub-DACs and capable of adding current to the one or more current source elements;
    a digital control unit coupled to the one or more digital calibration circuits and configured to switch between the one or more current source elements of the plurality of sub-DACs, to signal the one or more digital calibration circuits to add current to the one or more current source elements, and to determine a digital control reference current; and
    a current comparison circuit coupled to the digital control unit and the one or more current source elements of the plurality of sub-DACs and configured to compare a conduction current of the one or more current source elements to the digital control reference current and to produce a comparison signal, the current comparison circuit providing the comparison signal to the digital control unit.

8. The DAC of claim 7, wherein the current comparison circuit further comprises:
    a first current mirror capable of reflecting the digital control reference current to a first cascoded element; and
    a second current mirror capable of reflecting the conduction current from the one or more current source elements of the plurality of sub-DACs to a second cascoded element, wherein the first and second cascoded elements are coupled such that the digital control reference current and the conduction current control a voltage at a high impedance point, the voltage at the high impedance point comprising a signal to the digital control unit.

9. The DAC of claim 7, wherein the one or more digital calibration circuits further comprise one or more calibration circuits coupled to the one or more current source elements in the plurality of sub-DACs, the one or more calibration circuits being capable of adding current to the one or more current source elements based on the signal from the digital control unit.

10. A 12-bit digital-to-analog converter (DAC) comprising:
   a 12-bit digital signal line divided into digital signal portions such that a 3-bit least significant bits portion is directed to a first sub-DAC, a 3-bit most least significant bits portion is directed to a second sub-DAC, and a 6-bit most significant bits portion is directed to a third sub-DAC;
   a bias regeneration circuit configured to bias the first sub-DAC;
   the second sub-DAC and the third sub-DAC configured to receive a bias signal; and
   one or more digital calibration elements coupled to the first, second, and third sub-DACs such that the digital signal portions may be calibrated during the conversion process.

11. The 12-bit DAC of claim 10, wherein the bias regeneration circuit comprises a current mirror capable of achieving a desired voltage ratio, the bias regeneration circuit being coupled adjacent to the first DAC and the second DAC, the second DAC being coupled adjacent to the third DAC, the desired voltage ratio biasing the first, second, and third DACs at different voltages.

12. The 12-bit DAC of claim 11, wherein the current mirror comprises a first PMOS transistor having a gate connected to a first control signal and a second PMOS transistor having a gate connected to a second control signal.

13. The 12-bit DAC of claim 10, wherein the one or more digital calibration elements comprise:
   one or more digital calibration circuits coupled to one or more current source elements of the first, second, and third sub-DACs and capable of adding current to the one or more current source elements;
   a digital control unit coupled to the one or more digital calibration circuits and configured to switch between the one or more current source elements of the first, second, and third sub-DACs, to signal the one or more digital calibration circuits to add current to the one or more current source elements, and to determine a digital control reference current; and
   a current comparison circuit coupled to the digital control unit and the one or more current source elements of the first, second, and third sub-DACs and configured to compare a conduction current of the one or more current source elements to the digital control reference current and to produce a comparison signal, the current comparison circuit providing the comparison signal to the digital control unit.

14. The 12-bit DAC of claim 13, wherein the current comparison circuit comprises:
   a first current mirror capable of reflecting the digital control reference current to a first cascoded element; and
   a second current mirror capable of reflecting the conduction current from the one or more current source elements of the first, second, and third sub-DACs to a second cascoded element, wherein the first and second cascoded elements are coupled such that the digital control reference current and the conduction current control a voltage at a high impedance point, the voltage at the high impedance point comprising a signal to the digital control unit.

15. The 12-bit DAC of claim 13, wherein the one or more digital calibration circuits further comprise one or more calibration circuits coupled to the one or more current source elements in the first, second, and third sub-DACs, the one or more calibration circuits being capable of adding current to the one or more current source elements based on the signal from the digital control unit.

16. A 14-bit digital-to-analog converter (DAC) comprising:
   a 14-bit digital signal line divided into digital signal portions such that a 4-bit least significant bits portion is directed to a first sub-DAC, a 6-bit most least significant bits portion is directed to a second sub-DAC, and a 4-bit most significant bits portion is directed to a third sub-DAC;
   a bias regeneration circuit configured to bias the first sub-DAC;
   the second sub-DAC and the third sub-DAC configured to receive a bias signal; and
   one or more digital calibration elements coupled to the first, second, and third sub-DACs such that the digital signal portions may be calibrated during the conversion process.

17. The 14-bit DAC of claim 16, wherein the bias regeneration circuit comprises a current mirror capable of achieving a desired voltage ratio, the bias regeneration circuit being coupled adjacent to the first DAC and the second DAC, the second DAC coupled adjacent to the third DAC, the desired voltage ratio biasing the first, second, and third DACs at different voltages.

18. The 14-bit DAC of claim 17, wherein the current mirror comprises a first PMOS transistor having a gate connected to a first control signal and a second PMOS transistor having a gate connected to a second control signal.

19. The 14-bit DAC of claim 16, wherein the one or more digital calibration elements comprise:
   one or more digital calibration circuits coupled to one or more current source elements of the first, second, and third sub-DACs and being capable of adding current to the one or more current source elements;
   a digital control unit coupled to the one or more digital calibration circuits and configured to switch between the one or more current source elements of the first, second, and third sub-DACs, signal the one or more digital calibration circuits to add current to the one or more current source elements, and determine a digital control reference current; and
   a current comparison circuit coupled to the digital control unit and the one or more current source elements of the first, second, and third sub-DACs and configured to compare a conduction current of the one or more current source elements to the digital control reference current and to produce a comparison signal, the current comparison circuit providing the comparison signal to the digital control unit.

20. The 14-bit DAC of claim 19, wherein the current comparison circuit comprises:
   a first current mirror capable of reflecting the digital control reference current to a first cascoded element; and
   a second current mirror capable of reflecting the conduction current from the one or more current source elements of the first, second, and third sub-DACs to a second cascoded element;
   wherein the first and second cascoded elements being coupled such that the digital control reference current and the conduction current control a voltage at a high impedance point, the voltage at the high impedance point comprising a signal to the digital control unit; and
   the one or more digital calibration circuits further comprising one or more calibration circuits coupled to the one or more current source elements in the first, second, and third sub-DACs, the one or more calibration circuits being capable of adding current to the one or more current source elements based on the signal from the digital control unit.

* * * * *